Figure 1:
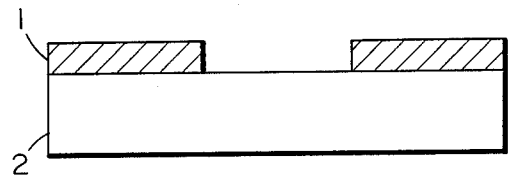

United States Patent [19]

Bott et al.

[11] Patent Number: 4,857,426

[45] Date of Patent: Aug. 15, 1989

[54] PHOTO POLYMERS AND USES THEREOF

[75] Inventors: David C. Bott, Warwickshire; Lucy M. Connors, Sunbury-on-Thames, both of England

[73] Assignee: The British Petroleum Company p.l.c., London, United Kingdom

[21] Appl. No.: 224,982

[22] Filed: Jul. 27, 1988

[30] Foreign Application Priority Data

Aug. 1, 1987 [GB] United Kingdom ................. 8718274
Jan. 27, 1988 [GB] United Kingdom ................. 8801824

[51] Int. Cl.$^4$ .............................................. G03C 5/00
[52] U.S. Cl. .................................... 430/18; 430/287; 430/326; 430/330
[58] Field of Search ................. 430/326, 330, 287, 18

[56] References Cited

U.S. PATENT DOCUMENTS 4,496,702 1/1985 Bott et al. ........................... 526/285
4,798,782 1/1989 Allen ............................... 430/330 X

FOREIGN PATENT DOCUMENTS 0233023 8/1987 European Pat. Off. .

Primary Examiner—Paul R. Michl
Assistant Examiner—Cynthia Hamilton
Attorney, Agent, or Firm—Brooks, Haidt, Haffner & Delahunty

[57] ABSTRACT

This invention relates to dry processable photo polymers, a method for their production and uses thereof. The photo polymers are produced by selectively irradiating discrete zones of a precursor polymer by UV or visible light followed by thermal oxidation to create polymer films which have modified optical and surface relief properties. Such photo polymers can be used in a number of applications eg wave guiding.

9 Claims, 1 Drawing Sheet

PHOTO POLYMERS AND USES THEREOF

The present invention relates to photo polymers, to a method of producing films of such polymers and users thereof.

There is a growing requirement for high resolution photosensitive materials in which, by virtue of a change in refractive index and/or a change in thickness, images and patterns can be recorded. Such photosensitive materials can be used for the production of eg. holograms, waveguides, diffraction gratings and holographic optical elements. Furthermore, if the recording of images is in the form of a surface relief profile this can be used to mass replicate the image. Several techniques have been developed for this purpose, one such method is to emboss images from a metal master into a plastic sheet. This is achieved mainly by the deposition of an electrically conductive metallic layer onto the surface to be replicated. This technique creates a first generation metal master which is then used to emboss the image into a sheet of plastic.

One of the most commonly used materials for this purpose is a photoresist. However a photoresist has the disadvantage that it requires that use of wet or solvent developers to arrive at the final product. Such wet processing steps can result in spurious undulations in the material which in turn can cause the metal master to key into the photoresist layer thereby preventing the master from being lifted off this layer cleanly.

The object of the present invention is to produce a dry processable photo polymer which can record an image or pattern in the form of surface relief or as a variation in refractive index and also avoids the wet development stage.

Accordingly, the present invention is a coherent polymer film, said polymer film having localised zones of a material with modified optical and surface relief properties, said zones being integral with the polymer film and being derivable by the steps of (i) photo-oxidation comprising irradiation of selective areas followed by (ii) thermal oxidation comprising heating, the steps being carried out in the presence of an oxidising gas, of a film of a precursor polymer of the formula (I) or containing repeating units of formula (I).

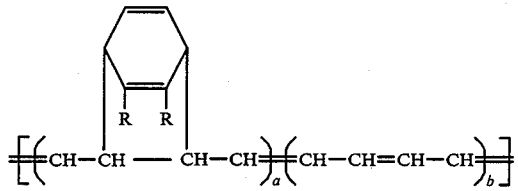

wherein
R is a group selected from —H, an alkyl, a haloalkyl, an ester and combinations thereof,
a and b are such that
(a+b) has a value from 20–50,000, and
a/(a+b) has a value from 0.1 to 1.

The group R is suitably H, or a $C_1$–$C_4$ alkyl, a $C_1$–$C_4$ haloalkyl or an ester of a $C_1$–$C_4$ carboxylic acid. One or more of the groups —H, —$CF_3$ and —$COOCH_3$ are preferred, especially —$CF_3$.

Precursor polymers of formula (I) as defined above preferably are such that (a+b) has a value from 50–50,000 and the value of a/(a+b) is from 0.25 to 1.

The steps (i) and (ii) above initiate oxidative reactions in polymers. Thus, the coherent polymer film derived by the steps (i) and (ii) above from a precursor polymer (I) may have the carbon atoms which were allylic or vinylic in (I) substituted by oxygenated functions such as hydroxyl, alkoxyl or carbonyl functions. Both steps (i) and (ii) may also cause the carbon atoms to add to other carbon atoms elsewhere in the same polymer or in another polymer chain to form cross links.

By "modified" is meant herein that specific discrete areas within the coherent polymer film have different optical properties and/or thickness from that of the remainder of the film.

According to a further embodiment the present invention is a process for producing coherent polymer films having localised zones of a material with modified optical and surface relief properties, said process comprising:

(a) selectively subjecting discrete areas of a film of the precursor polymer comprising structural units of formula (I) to photo-oxidation by irradiating in the presence of oxygen or a gas containing oxygen with a light source having a wave length in the ultraviolet and/or visible regions followed by (b) thermal oxidation by heating in an atmosphere of oxygen or a gas containing oxygen to a temperature from 20° to 200° C. so that the resultant film has zones with modified optical and surface relief properties.

The term 'polymer' as used herein is meant to embrace both polymers and copolymers of the precursor monomer(s).

Thus, whereas the irradiated areas have a refractive index of 1.499±0.005 at 632.8 nm, the non-irradiated areas have a refractive index of 1.567±0.01 at the same wave length of 632.8 nm, a difference of 0.068±0.015. Similarly, the irradiated areas have a thickness greater than the areas that are non-irradiated upon thermal oxidation. The magnitude of the difference in height between the two areas caused by irradiation is related to level of irradiation incident thereon. In particular, sensitivity which signifies the amount of energy required to produce the desired surface relief effect on the film (in volume terms) is in the range 5 to $7 \times 10^6$ J/cm$^3$. Thus, to achieve a depth of 1250 Å, approximately 600 mJ/cm$^2$ is required, whereas for a depth of 4000 Å, approximately 400 J/cm$^2$ is required. Also, the resolution which is the minimum dimension of the surface relief patterns that can be generated is at least 0.35 micrometers.

In order to accomplish the invention, discrete areas of the film of the precursor polymer can be selectively irradiated with a light source, e.g. by protecting other areas of the film using a contact mask prior to irradiation. Thereafter, upon irradiation of the unmasked, exposed areas with the light source followed by removal of the protective contact mask and then heating in the presence of oxygen or a gas containing oxygen, the selectively irradiated areas form zones with optical and surface relief properties which are different from those of the masked areas of the precursor polymer film not irradiated with the light source. However, if the final heating step is done in the absence of oxygen or a gas containing oxygen, the non-irradiated areas transform into poly(acetylene). Since poly(acetylene) is known to undergo a chemical reaction with oxygen, in this case, it is possible to expose these areas of poly(acetylene) formed by the heating step subsequently to an atmosphere of oxygen or a gas containing oxygen. In this manner a coherent polymer film is formed which has integral therewith specific discrete areas of a material other than poly(acetylene) with modified optical and surface relief properties. Alternatively, a suitably focussed laser beam, or interfering beams, can be used to "write" patterns directly without the use of a mask.

In order to have a better understanding of the process by which the polymer films of the present invention can be produced from the film of the precursor polymer (I), the latter can be represented in a simplified manner as formula (Ia).

 (Ia)

wherein the group A represents the part of the precursor polymer molecule containing the bicyclic grouping and B represents the conjugated polyene grouping.

Thus, in the areas of the polymer film of the present invention which were formed by a thermal oxidation of step (ii) alone, a large proportion of the A groups thermally eliminate 1,2-bis (substituted) benzene units to leave behind 1,2-ethenyl units in the polymer backbone before oxidative reactions can modify the structure of the bicyclic portion of group A to prevent elimination of the substituted benzene units as represented by the equation

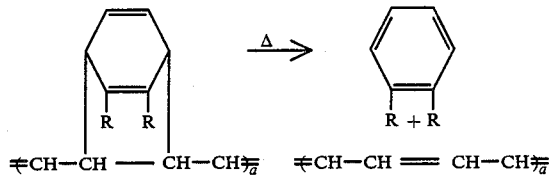

However, in areas of the polymer film formed by the initial photo-oxidation, the oxidative processes compete more effectively with the aforementioned elimination reactions. Photo-oxidation of the bicyclic portion of unit A modifies the structure of that portion in such a manner that the likelihood of thermal elimination e.g of a substituted benzene unit, is either substantially reduced or prevented and hence at least a major proportion of the entire group remains linked to the polymer matrix.

Thus, possible structures of the polymer in the solvent cast films of the present invention can be represented by the formula (II) below:

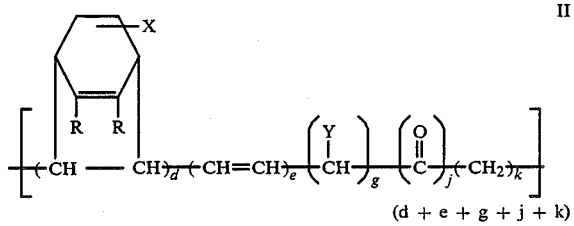

Thus, in the areas of the polymer film of the present invention in which R has the same significance as in formula (I) above; and each of X and Y are substituents which may be —H or —OH groups, divalent oxygen atoms linking two polymer chains, or, a cross linking group which is part of another polymer chain. $(d+e+g+j+k)$ is from 20–50,000 and represents the degree of polymerisation as does $(a+b)$ in formula I. For simplicity the polymer of formula (II) may be represented as formula (IIa):

 IIa

In such a polymer, that area of the film which is formed by photo-oxidation has a significantly larger proportion of the groups D than in the area which is formed by thermal oxidation.

In other words, the area of the photo-oxidised polymer in the film of the aforesaid invention is characterised by a proportion of group D in formula (IIa) such that: $d/(d+e+g+j+k)$ is suitably from 0.05 to 0.5, preferably from 0.1 to 0.3.

Similarly, the area of the polymer in the film of the present invention formed by thermal oxidation is characterised by a proportion of group D in formula (IIa), say D' such that in this case $d/(d+e+g+j+k)$ is suitably from 0 to 0.2, preferably from 0.01 to 0.05.

Both areas of the polymer film of the present invention may include the eliminated product 1,2 (substituted) benzene which may be trapped in the cross-linked polymer matrix.

Thus, the ratio of the groups of D/D' in the polymer film of the present invention is suitably greater than 1.1 per unit area, preferably greater than 3 and most preferably greater than 5 per unit area.

THE PRECURSOR POLYMERS

The polymers which may be subjected to irradiation may be copolymers containing only the repeating units (a) and (b) shown in Formula (I). Alternatively they may contain additional repeating units derived from other comonomers such as cyclopentene, norbornene or substituted derivatives thereof. Examples of such additional repeating units are norbornene or substituted derivatives thereof.

The precursor polymer may be produced by copolymerisation of the respective monomers by metathesis polymerisation as claimed and described in our published EP-A-0080329 and EP-A-0173473. Polymers containing repeating units according to Formula (I) can for example, be produced by mixing organic solutions of the monomers to the desired ratio followed by polymerisation in the presence of a suitable metathesis catalyst. The solution may be polymerised at temperatures from about −50° C. to about 70° C., preferably 0° to 10° C., in an atmosphere substantially inert to the monomer reactants and to the polymers being prepared under the reaction conditions employed.

Examples of suitable metathesis catalysts include molybdenum pentachloride/tetra-alkyl tin and tungsten hexachloride/tetra-alkyl tin.

FORMING THE PRECURSOR POLYMER INTO A FILM

The precursor polymer may be formed into polymer films of any desired shape prior to irradiation and heat treatment. It is preferable that the precursor polymers are shaped into films by spin coating. In spin coating, the precursor polymer is initially dissolved in a suitable solvent to give a solution of a viscosity appropriate for spinning or casting of films. The actual concentration will depend upon many factors such as the molecular weight distribution of the polymer, the solvent used, the film thickness desired and the spinning or casting conditions. A typical concentration is in the range of 100 to 150 grams per liter. The solvent is preferably an organic solvent such as acetone, chloroform, ethyl acetate, toluene, xylene, methyl ethyl ketone and the like. Methyl ethyl ketone is most preferred. Thereafter, the surface of a substrate is flooded with a solution of the precursor polymer and then spun at speeds between 1,500 and 10,000 rpm for a period of 5 to 60 seconds. As the solution is spun into a thin film, the solvent is lost by evaporation leaving a uniform thin layer of precursor polymer. A suitable substrate for spin coating is typically a flat disc of a hard material (e.g. glass) with a polished surface. By this method films of the precursor polymer having a thickness of up to 5 micrometers can be produced.

PRODUCING COHERENT POLYMER FILMS HAVING LOCALISED ZONES WITH MODIFIED OPTICAL AND SURFACE RELIEF PROPERTIES (i) Irradiation In order to produce coherent polymer films having discrete localised zones with modified optical properties, discrete areas of the film of the precursor polymer formed by e.g. spin coating are selectively irradiated with light having a wave-length in the ultraviolet and-/or visible regions suitably below 450 nm, preferably below 360 nm. The thickness of the precursor polymer to be irradiated is suitably from 1000–10,000 Å. It is preferable to physically mask the areas which are not to be exposed to light. Such masking techniques are well known in the photographic and semiconductor industries.

Alternatively a focussed laser beam, or interfering beams, of a suitable wave length can be used to irradiate localised zones.

The light source can be any source which is capable of generating light with wave-lengths in the above regions, although sources such as xenon lamps and UV lasers have been found particularly suitable.

In order to ensure proper transformation of the irradiated precursor polymer films into the coherent polymer films having discrete zones with modified optical and surface relief properties, the selective irradiation of the precursor polymer with light should occur in the presence of oxygen or a gas containing oxygen. The duration for which the irradiation is carried out will vary according to the intensity and wavelength of the irradiation used, the thickness or the height of the relief pattern on the polymer film desired and upon the degree of modification desired. It will be typically from 0.25 seconds to 200 minutes, preferably from 10 seconds to 150 minutes for a surface which is ca 1 micrometer thick and about 1.5 mm in diameter using a UV laser of an output of 325 nm and 8 mW power.

(ii) Heating

The precursor polymer film selectively irradiated with light and after removal of the masking material, if any used to protect the other areas, is transformed upon heating to elevated temperatures into a polymer film having integral therewith discrete areas with modified optical and surface relief properties. The temperature and duration of the heat treatment will depend upon the rate of transformation desired. The irradiated precursor polymer film is suitably heated at temperatures below 130° C., preferably from 70° to 120° C. or in an atmosphere containing oxygen or a gas containing oxygen.

The heating procedure may be carried out for a period from about 30 minutes to about 100 hours, preferably from 90 minutes to 20 hours, to form the (co)polymer film of the present invention. Since the rate of transformation depends on temperature, lower temperatures require longer durations of heating. The conditions of the heating step are preferably selected such that the relative difference in thickness of the two zones in the transformed product after photo-oxidation and thermal oxidation step is suitably from 100 Angstroms to 3 micrometers, preferably up to 2 micrometers.

It will be appreciated that upon heating as described above, not only are the irradiated areas modified with respect to their optical and surface relief properties but the non-irradiated areas of the film are also modified in these characteristics although the relative extent of modification of the two areas is usually different.

A pristine precursor polymer film loses from 66–75% of its thickness when transformed to the final polymer film. Irradiated zones of precursor polymer contract to a lesser extent when transformed without loss of film continuity. Distinct zones of the product are therefore thicker and/or have different refractive indices than adjacent zones of polymer film in the products of this invention.

Such films could be useful in the production of holographic optical elements, gratings, chip interconnects, fibre optic couplers, devices for integrated optics eg. guided wave elements, laser mirrors, fibre optic wavelength demultiplexers, bar code readers for supermarkets, head up displays, projection screens, lenses, mirrors, monochromators, aberration correctors, beam splitters and also as image holograms for security applications, graphic art and decorative applications.

The principle of the present invention is further illustrated by reference to the drawing which is a diagrammatic representation of the process of the invention and by the following experiments in which the preparation and properties of a modified material derived by irradiation of a precursor of poly(acetylene) are described.

Figure 2:
Figure 2:
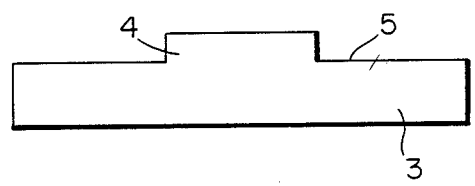

In the drawing FIG. 1 illustrates a precursor polymer film which is subjected to irradiation. The film comprises a mask 1 to protect areas of the precursor polymer film 2 from irradiation. After irradiation of the unmasked areas, removal of the mask, and heating in the presence of oxygen the product shown in FIG. 2 is obtained comprising a polymer film 3 containing an irradiated area 4 and a non-irradiated area 5. However, this invention includes variations, modifications and equivalent embodiments which fall within the spirit of this disclosure.

In the data below, Examples illustrating the invention are identified by numbers. Comparative Tests not according to the invention are identified by letters.

EXAMPLE 1

A precursor polymer of formula (I) was used. This was made by the method disclosed in in U.S. Pat. No. 4,496,702 (column 2 line 57–column 3 line 9, employing the $WCl_6/Me_4Sn$ Catalyst.

A sample of precursor polymer of formula (I) with $R=CF_3$, $(a+b)=$ca 4,000 and $a/(a+b)=$ca 0.8 was spun onto a KRr disc to form a film of ca 0.6 micrometers thickness. The sample was then irradiated with a U.V. source (1000 W xenon arc lamp suitably filtered to remove excess IR radiation) in the presence of air for 5 minutes and heated in air for 16 hours at 120° C. An infrared absorption spectrum of the resultant polymer film was then recorded.

COMPARATIVE TEST A

A second sample of the same precursor polymer was treated in the same way as in Example 1 above except that it was not irradiated with a U.V. source.

An IR spectrum of the resultant product was again recorded and the two spectra from Example 1 and Comparative Test A were compared.

IR spectra of 1,2-bis(trifluoromethyl)benzene and of the precusor polymer of formula (I) with R=CF$_3$, $(a+b)$=ca 4,000 and $a/(a+b)$=ca 0.8 before U.V. irradiation or heating were also recorded to aid interpretation of the spectra of products from Example 1 and Test A above.

Comparison of the spectra indicated that the percentage of D groups (as in formula II above) was above 16% in the product of Example 1 whereas it was only about 3% in the product of Test A. Thus the ratio D/D' (as defined hereinabove) was found to be between 5 and 6. The IR spectra of both samples were also consistent with the presence of the additional groups E, G, J, K shown in the context of formula II above.

COMPARATIVE TEST B

A sample of the precursor polymer of formula (I) above (wherein R=CF$_3$, $(a+b)$=ca 4,000 and $a/(a+b)$=ca 0.8) was cast as a film (ca 10 micrometers thickness) and heated to 100° C. in air for 14 days. The resultant product was characterised by $^{13}$C solid state nmr, pyrolysis-gas chromatography-mass spectroscopy and elemental analysis. The results of these analyses were consistent with the presence in the product of the groups E, G, J, K and D of formula II together with some 1,2-bis(trifluoromethyl)benzene.

EXAMPLE 2

The precursor polymer used in Example 1 above was spin coated onto a quartz disc and placed in a Karl Suss MJB3 mask aligner. The sample was then exposed through a suitable mask to radiation from a mercury lamp for ca 1000 seconds. After exposure the sample was heated under vacuum for 12 hours at 80° C. After this transformation process the surface relief of the sample was monitored using a Dektak IIA surface profiler for a period of 4 weeks during which time the sample was stored in air to allow oxidation processes to occur. It was found that the non-irradiated areas of the sample changed their optical properties (i.e became transparent). The surface relief of 0.25 micrometers measured initially on the sample reduced by 30% after the prolonged exposure to air. When the film was fully transparent thereby signifying complete oxidation there was no further variation in surface relief.

EXAMPLE 3

The procedure of Example 2 was repeated except that now the sample was heated in air at 100° C. for 4 hours instead of heating under vacuum. The surface relief was found to be similar to that of the previous sample in Example 2 above after complete oxidation.

EXAMPLE 4

The height of the irradiated areas above the unirradiated areas as a function of exposure level was investigated after heating. Using a helium cadmium U.V laser (which emits at a wavelength of 325 nm) a spin coated film sample (0.5 micrometers thickness) of precursor polymer was used as in Example 1 and was exposed to radiation for times ranging from 0.25 seconds to 64 seconds. The results of this experiment are given in the Table below. The height of the resulting surface relief effect for this experiment was found to be proportional to the square root of the exposure level.

TABLE

| Exposure time at 325 nm (seconds) | Surface relief height (angstroms) |
| --- | --- |
| 64 | 2200 |
| 32 | 1500 |
| 16 | 900 |
| 8 | 600 |
| 4 | 500 |
| 2 | 350 |
| 1 | 300 |
| 0.5 | 180 |
| 0.25 | 130 |

EXAMPLE 5

The optical properties of a copolymer film of the present invention having selectively irradiated and non irradiated areas followed by thermal oxidation as in Example 3 above were investigated. Using elipsometric techniques, refractive indices of the two areas were measured. The non irradiated areas were found to have a refractive index of 1.567±0.01 at 632.8 nm; the corresponding refractive index of the irradiated areas was found to be 1.499±0.005. The two areas were found to have very low and similar absorption characteristics in the visible region of the electromagnetic spectrum (less than $10^3$ cm$^{-1}$).

A graphic representation of the method used in the present invention is shown in the accompanying drawing.

EXAMPLE 6

A 7.5 micrometers film of polyacetylene precursor solution was spin-coated onto a substrate of 0.4 micrometers silicon oxide thermally grown onto an n-Silicon wafer. A pattern of parallel lines of varying widths between 2 and 1000 microns was imaged into the film by photomasking as in Example 3. The film was heated for 19 hours at 60° C. under vacuum followed by heating in air for 24 hours at 100° C. The sample was cooled in liquid nitrogen and cleaved perpendicular to the defined lines. Laser light of 632.8 nm wavelength was focussed on the cleaved edge using a microscope objective, and the imaged non-irradiated lines were clearly observed to be glowing as light was guided for a distance of several millimeters.

EXAMPLE 7

A 7.0 micrometer thick film of polyacetylene precursor solution was spin-coated onto a cleaned microscope slide and heated in air for 24 hours at 100° C. to produce a transparent film of high refractive index (1.57). Laser light of wavelength 632.8 nm was coupled into the film by clamping a high refractive index prism (refractive index 1.7) against the film and varying the angle of incidence until guiding was observed as a luminous line along the microscope slide.

We claim:

1. A coherent polymer film, said polymer film having localised zones of a material with modified optical and surface relief properties, said zones being integral with the polymer film and being derivable by the steps of
  (i) photo-oxidation comprising irradiation of selective areas followed by
  (ii) thermal oxidation comprising heating, the step(s) being carried out in the presence of an oxidising gas, of a film of a precursor polymer of the formula (I) or containing repeating units of formula (I)

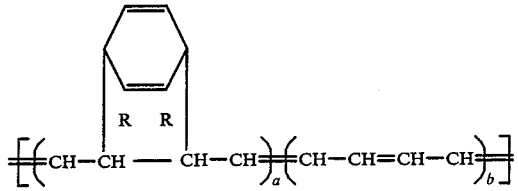

wherein
  R is a group selected from —H, an alkyl, a haloalkyl, an ester and combinations thereof,
  a and b are such that
  (a+b) has a value from 20-50,000, and
  a/(a+b) has a value from 0.1 to 1.

2. A coherent polymer film according to claim 1 wherein the group R is selected from H, a $C_1$-$C_4$ alkyl, a $C_1$-$C_4$ haloalkyl, and an ester of a $C_1$-$C_4$ carboxylic acid.

3. A coherent polymer film according to claim 1 wherein the Group R is a trifluoromethyl group.

4. A process for producing coherent polymer films having localised zones of a material with modified optical and surface relief properties, said process comprising:
  (a) subjecting discrete areas of a film of the precursor polymer comprising structural units of formula (I) to photo-oxidation by selectively irradiating in the presence of oxygen or a gas containing oxygen with a light source having a wave-length in the ultraviolet and/or visible regions followed by
  (b) subjecting the selectively irradiated polymer film from step (a) to thermal oxidation by heating in an atmosphere of oxygen or a gas containing oxygen to a temperature from 20° to 200° C. so that the resultant film has zones with modified optical and surface relief properties.

5. A process according to claim 4 wherein the photo-oxidation of the precursor polymer film is carried out using light having a wave length below 450 nm.

6. A process according to claim 4 wherein the thickness of the precursor polymer being subjected to photo-oxidation is from 1000-10000 Å.

7. A process according to claim 4 wherein the thermal oxidation step is carried out at a temperature below 130° C.

8. A process according to claim 4 wherein the relative difference in thickness between the two zones in the transformed product after photo-oxidation and thermal oxidation step(s) is from 100 Å to 3 micrometers.

9. A process according to claim 4 wherein the precursor polymer film loses from 66-75% of its thickness upon transformation to the final polymer film by photo-oxidation followed by thermal oxidation.

* * * * *

UNITED STATES PATENT AND TRADEMARK OFFICE
CERTIFICATE OF CORRECTION

PATENT NO. : 4,857,426

DATED : August 15, 1989

INVENTOR(S) : DAVID C. BOTT, et al.

It is certified that error appears in the above-identified patent and that said Letters Patent is hereby corrected as shown below:

Col. 6, line 61, insert a --)-- (close parenthesis) after "catalyst.".

Col. 8, line 1, correct spelling of word "precusor".

Signed and Sealed this

Twenty-fifth Day of December, 1990

*Attest:*

HARRY F. MANBECK, JR.

*Attesting Officer*  *Commissioner of Patents and Trademarks*